US006573544B1

(12) United States Patent
Lee

(10) Patent No.: US 6,573,544 B1
(45) Date of Patent: Jun. 3, 2003

(54) DATA INPUT/OUTPUT LINE STRUCTURE HAVING REDUCED RESISTANCE

(75) Inventor: Jae-young Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/456,733

(22) Filed: Dec. 8, 1999

(30) Foreign Application Priority Data

Apr. 27, 1999 (KR) .............................. 99-15029

(51) Int. Cl.[7] .............................. H01L 27/108
(52) U.S. Cl. ................ 257/296; 257/298; 257/300; 257/304; 257/311
(58) Field of Search ................ 257/296, 298, 257/300, 304, 310–315

(56) References Cited

U.S. PATENT DOCUMENTS 4,954,992 A * 9/1990 Kumonoya et al.
5,691,933 A * 11/1997 Takenaka

FOREIGN PATENT DOCUMENTS

JP          7312415          11/1995

OTHER PUBLICATIONS

Yeun–yoo Lee. "DRAM Design," 1st Edition Nov. 5, 1996, Reprinted Mar. 25, 1997, pp 101–107 and translation.

* cited by examiner

*Primary Examiner*—Fetsum Abraham
(74) *Attorney, Agent, or Firm*—F. Chau & Associates, LLP

(57) ABSTRACT

A data input/output line structure having reduced resistance for a semiconductor memory device includes a first signal line formed from a first metal layer, the first signal line being connected to a bit line of a memory cell; a second signal line formed from a second metal layer, the second signal line being arranged parallel to the first signal line; and a plurality of strapping connectors for connecting the first signal line and the second signal line. The first and the second signal lines having first and second resistances, respectively, wherein the second resistance is lower than the first resistance.

17 Claims, 3 Drawing Sheets

DATA INPUT/OUTPUT LINE STRUCTURE HAVING REDUCED RESISTANCE

BACKGROUND OF THE INVENTION

1. Field of the Invention

The present invention relates to semiconductor memory devices, and more particularly, to a data input/output line structure having reduced resistance.

2. Description of the Related Art

In general, one way of improving performance of a computer system is to improve performance of the memory associated with the central processing unit (CPU) in addition to improving the operating speed of the CPU itself. The performance of the memory device can be improved by increasing its bandwidth per unit time. The amount of data that can be read from or written to a memory at any one time is a function of the number of data input/output lines available from the memory. Thus, depending on the number of data input/output lines, bit line data of memory cells are selectively transferred to the data input/output lines through data input/output circuits.

As semiconductor memory capacity increases, chip sizes and lengths of internal lines are also increased. The lengthened data lines, such as word lines, bit lines and data input/output lines, degrade speed and power performance of the semiconductor memory device. A word line strapping method can be used to reduce the effects from long lines. For example, a metallic line can be formed on a gate polysilicon to reduce delay in word lines.

Data input/output lines are often the final paths of travel for data of memory cells. Data read/write speed of a semiconductor memory device is affected by line load on the data input/output lines. That is, the operation speed of the semiconductor memory device is determined either by a time period from when data to be read from the memory cell is sensed to when the data is output via the data input/output lines, or by a time period required to transmit data to be written to the memory cell from the data input/output lines. Thus, increased resistance of the data input/output lines due to longer line lengths at the data input/output lines degrades the operating speed of the semiconductor memory device.

Thus, a new data input/output line structure having reduced resistance is desired to prevent a reduction in the speed of semiconductor memory devices.

SUMMARY OF THE INVENTION

It is an object of the present invention to provide a data input/output line structure having reduced resistance to improve the operation speed of semiconductor memory devices.

According to one aspect of the present invention, a semiconductor memory device includes a data input/output line structure through which data is input to or output from memory cells in a semiconductor memory device, comprising: a first signal line formed from a first metal layer, the first signal line being connected to a bit line of one of the memory cells; a second signal line formed from a second metal layer, the second signal line being parallel with the first signal line; and a plurality of strapping connectors for connecting the first signal line and the second signal line. The second metal layer may have a lower resistance than that of the first metal layer. The first and the second signal lines are arranged in parallel with each other and are also perpendicular to the bit line of the memory cell. The plurality of strapping connectors provide a plurality of connections between the first signal line and the second signal line. The connections between the first and the second signal lines are arranged at substantially regular intervals. Each of the plurality of strapping connectors also has a hole to be filled with one of the first and the second metal layers. In particular, the hole is filled with a material of one of the first and the second metal layers wherein the material filling the hole has higher penetrability than that of the other material.

In accordance with the data input/output line structure of the present invention, the resistance of the data input/output line can be reduced, thereby reducing a delay in the data input/output line.

BRIEF DESCRIPTION OF THE DRAWINGS

The above object and advantages of the present invention will become more apparent by describing in detail preferred embodiments thereof with reference to the attached drawings in which.

DESCRIPTION OF PREFERRED EMBODIMENTS

Figure 1:
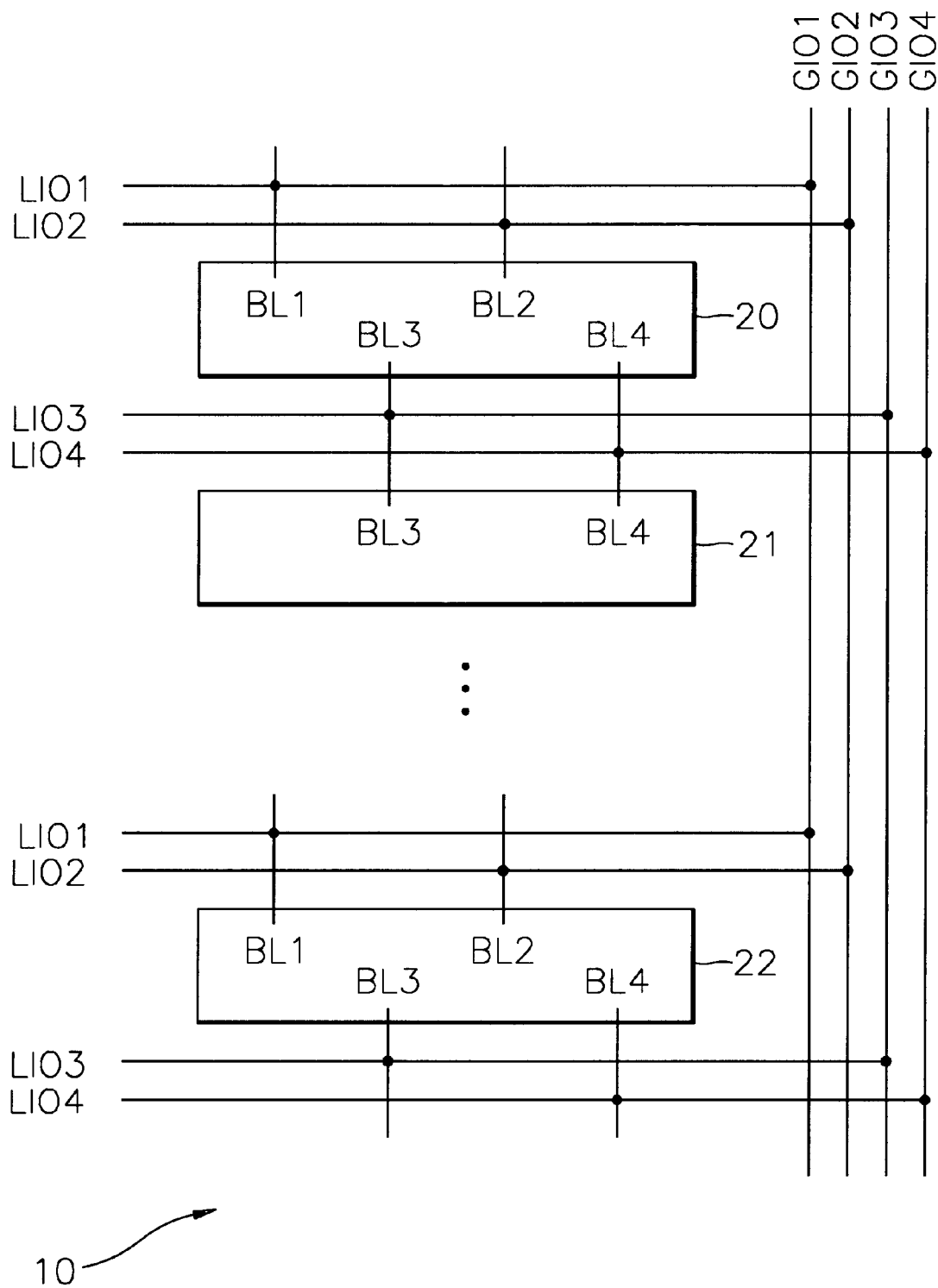
FIG. 1 is a layout of a semiconductor memory device including data input/output lines according to a preferred embodiment of the present invention.

The present invention now will be described more fully with reference to the accompanying drawings, in which preferred embodiments of the present invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. The same reference numerals in different drawings represent the same elements.

The present invention relates to a semiconductor memory device including a plurality of memory blocks each having a plurality of memory cells arranged in rows and columns, wherein memory cell data in each memory block are input and output through data input/output lines connected to bit lines of the memory cells. The structure of these data input/output lines will now be described.

FIG. 1 is a layout of a semiconductor memory device having data input/output lines according to a preferred embodiment of the present invention. Referring to FIG. 1, a semiconductor memory device 10 includes a plurality of memory blocks 20, 21, . . . , 22, local data input/output lines LIOi (i=1~4) and global data input/output lines GIOi (i=1~4).

The local data input/output lines LIOi (i=1~4) are shared by the adjacent memory blocks 20, 21, . . . , 22, and are connected to each of the memory blocks 20, 21, . . . , 22. Cell bit lines BLi (i=1~4) of memory cells (not shown) in each memory block 20, 21, . . . , 22 are connected to the local data input/output lines LIOi (i=1~4) through bit line sense amplifiers (not shown). The local data input/output lines LIOi (i=1~4) are connected to the corresponding global data input/output lines GIOi (i=1~4) while data line sense amplifiers (not shown) are interposed therebetween. Data input/output buffers (not shown) are connected to the global data input/output lines GIOi (i=1~4) such that data input to or output from the semiconductor memory device are applied to the global data input/output lines GIOi (i=1~4) through the data input/output buffers.

Therefore, data of the memory cells are input or output through the cell bit lines BLi (i=1~4), the bit line sense amplifiers, the local data input/output lines LIOi (i=1~4), the data line sense amplifiers, the global data input/output lines GIOi (i=1~4), and the data input/output buffers. The bit line sense amplifiers sense and amplify the data of the cell bit lines BLi (i=1~4), the data line sense amplifiers sense and amplify the data of the local data input/output lines LIOi (i=1~4), and the data input/output buffers transfer data which is input to or output from the semiconductor memory device 10. These functions of the bit line sense amplifiers, the data line sense amplifiers and the data input/output buffers are well known to those skilled in the art.

The local data input/output lines LIOi (i=1~4) are arranged perpendicular to the cell bit lines BLi (i=1~4), and the global data input/output lines GIOi (i=1~4) are arranged perpendicular to the local data input/output lines LIOi (i=1~4). The number of local data input/output lines LIOi (i=1~4) and global data input/output lines GIOi (i=1~4) may be varied. In this embodiment, it is assumed for convenience of explanation that the semiconductor device 10 includes four local data input/output lines LIOi (i=1~4) and four global data input/output lines GIOi (i=1~4).

The local data input/output lines LIOi (i=1~4) are connected to the cell bit lines BLi (i=1~4) by column select circuits (not shown) in each of the memory blocks 20, 21, . . . , 22, which select the cell bit lines BLi (i=1~4). The column select circuits selectively connect the cell bit lines BLi (i=1~4) to the local data input/output lines LIOi (i=1~4) through multiplexing in response to a column address.

Figure 2A:
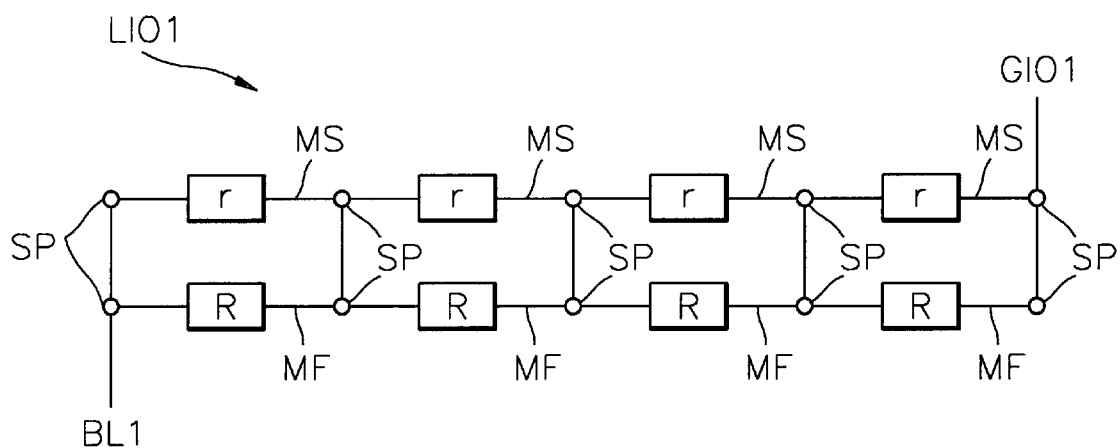
FIG. 2A is a detailed view of a local data input/output line of FIG. 1.

FIG. 2A is a detailed view of one of the local data input/output lines LIOi (i=1~4) shown in FIG. 1. Referring to FIG. 2A, a first local data input/output line LIO1 includes a first signal line MF of a first metal layer having a first resistance R per unit segment, a second signal line MS of a second metal layer having a second resistance r per unit segment, and a plurality of strapping connectors SP connecting the first signal line MF and the second signal line MS, between a first global data input/output line GIO1 and a first cell bit line BL1.

Preferably, the ratio of the second resistance r of the second metal layer to the first resistance R of the first metal layer is 1:10. Also, the first metal layer may be formed of, for example, tungsten (W), while the second metal layer may be formed of, for example, aluminum (Al). A strapping connector SP is constructed as a contact hole or a via hole for connecting the first signal line MF and the second signal line MS which is placed on the first signal line MF. The second metal layer of the second signal line MS fills the contact holes or the via holes to contact the first metal layer of the first signal line MF to be electrically connected thereto.

Figure 2B:
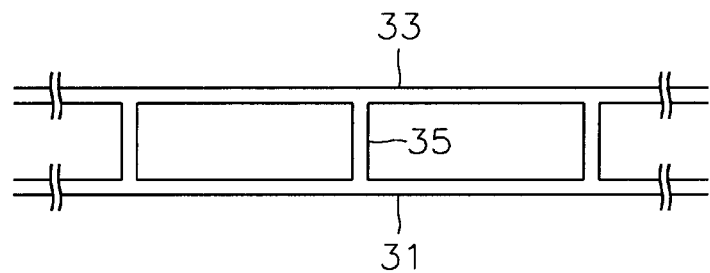
FIG. 2B is a partial cross-sectional view of a local data input/output line of FIG. 1.

FIG. 2B shows a partial cross-sectional view of the first local data input/output line LIO1. The first metal layer 31 and the second metal layer 33 are arranged in parallel with each other. The holes 35 are filled with a material of either the first or the second metal layer 31 or 33.

Here, the first metal layer material can solve problems in an interconnection process for filling the small contact holes or the via holes required for a high integration density and a fine design rule. That is, a conductive material having good penetrating properties is used for filling the holes each having a high aspect ratio. In this embodiment, the first metal layer is formed of tungsten (W). However, the first metal layer formed of tungsten (W) can be replaced by another metal layer formed of, for example, copper (Cu).

Resistance of the first local data input/output line LIO1 having the above structure can be calculated as follows. In the first local data input/output line LIO1, the first signal line MF and the second signal line MS, which are parallel, are connected by five strapping connectors SP which are transverse to the first and second signal lines MF and MS. Assuming that resistances of unit segments of the first and the second signal lines MF and MS defined by the strapping connectors SP are referred to as the first and the second resistances R and r, respectively, four parallel connection units each unit including one first resistance R and one second resistance r are connected in series. Thus, the resistance of the first local data input/output line LIO1 having the first and second signal lines MF and MS connected in parallel is expressed by the following equation.

$$\frac{4}{\frac{1}{R}+\frac{1}{r}} = \frac{4Rr}{R+r}$$

The resistance of the first and second signal lines MF and MS in parallel is lower than those of conventional data input/output lines. This difference will be explained through the following comparative example.

COMPARATIVE EXAMPLE

Figure 3:
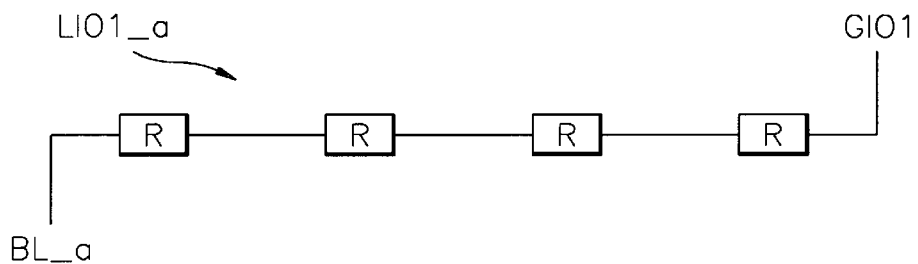
FIG. 3 shows conventional local data input/output line as a comparative example to the local data input/output line of FIG. 2.

FIG. 3 shows a conventional local data input/output line LIO1_a as a comparative example to the local data input/output line LIO1 of FIG. 2. Referring to FIG. 2, unlike the first local data input/output line LIO1 of FIG. 2, the local data input/output line LIO1_a includes only a first signal line MF without a second signal line MS and metal strapping connectors SP.

Assuming that the length of the local data input/output line LIO1_a is equal to that of the first local data input/output line LIO1 between the first global data input/output line GIO1 and the first bit line BL1, resistance of the local data input/output line LIO1_a of FIG. 3 is equal to 4R. Thus, the local data input/output line LIO1 of FIG. 2 according to the present invention has a much smaller resistance.

If the local data input/output line LIO1_a of FIG. 3 is formed of a second metal material of the second signal line MS of FIG. 2, the resistance of the local data input/output line LIO1_a is equal to 4r. This 4r resistance is also larger than the resistance of the first local data input/output line LIO1 of FIG. 2.

Figure 4:
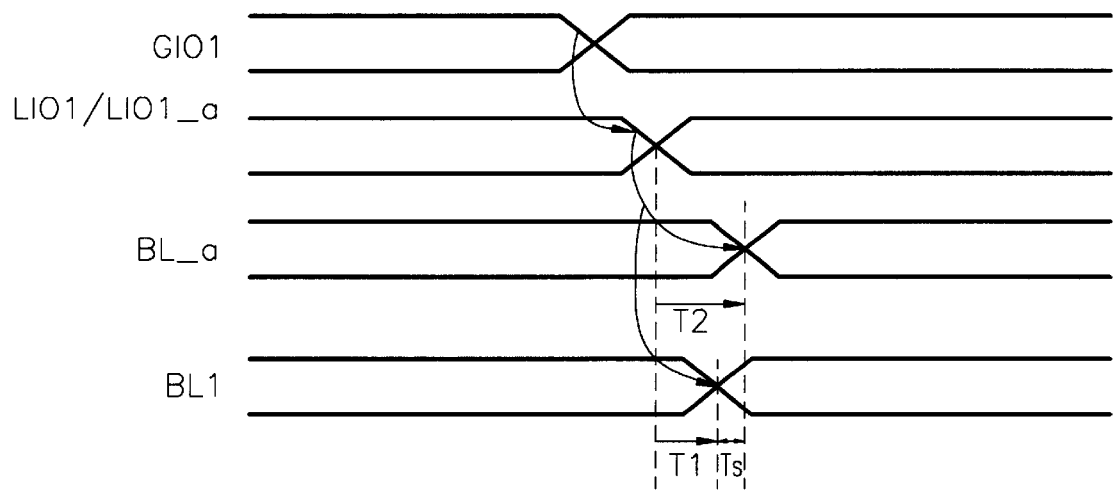
FIG. 4 is a timing diagram comparatively showing a delay in the local data input/output lines of FIGS. 2 and 3.

FIG. 4 is a timing diagram comparatively showing a delay difference between the local data input/output line of FIG. 2 and the local data input/output line of FIG. 3 as a comparative example. The timing diagram illustrates a write operation in a memory cell in the semiconductor memory device 10 of FIG. 1, for a duration from when write data is applied through the first global data input/output line GIO1 to when the write data is transferred to the first cell bit line BL1.

The write data applied through the first global data input/output line GIO1 is transferred to the first local data input/output line LIO1 of FIG. 2. The first local data input/output line LIO1 is connected to the first cell bit line BL1 selected by column select circuits (not shown), and the write data transferred to the first local data input/output line LIO1 is then transferred to the first cell bit line BL1. Because the first local data input/output line LIO1 has the resistance of $$\frac{4Rr}{R+r},$$

the write data is delayed for a predetermined time T1 in the first local data input/output line LIO1 and transferred to the first bit line BL1.

Meanwhile, in the comparative example of FIG. 3, write data applied through the global data input/output line GIO1 is transferred to the local data input/output line LIO1__a of FIG. 3 and then transferred to the cell bit line BL__a. Because the local data input/output line LIO1__a has a resistance of 4R, the write data is delayed for a predetermined time T2 in the local data input/output line LIO1__a and transferred to the cell bit line BL__a.

As described above, since the resistance $$\frac{4Rr}{R+r}$$

of the first data input/output line LIO1 according to the preferred embodiment of the present invention is smaller than the resistance 4R of the data input/output line LIO1__a in the comparative example, the first data input/output line LIO1 according to the present invention can shorten the delay by the difference TS between the T2 and T1 in transferring the write data to the first bit line BL1.

The above preferred embodiments of the present invention are merely illustrative and the present invention is not limited to those embodiments. It will be understood by those skilled in the art that various changes in form and details may be made in the embodiments without departing from the spirit and scope of the invention as defined by the appended claims.

What is claimed is:

1. A data input/output line structure through which data is input to or output from memory cells in a semiconductor memory device, comprising:
   a first signal line formed from a first metal layer, the first signal line being connected to a bit line of one of the memory cells;
   a second signal line formed from a second metal layer, the second signal line being parallel with the first signal line; and
   a plurality of strapping connectors for connecting the first signal line and the second signal line, wherein the second metal layer has a lower resistance than that of the first metal layer.

2. The data input/output line structure of claim 1, wherein the first and second signal lines are arranged to be perpendicular to the bit line of the memory cell.

3. The data input/output line structure of claim 1, wherein the first metal layer is formed of tungsten.

4. The data input/output line structure of claim 1, wherein the second metal layer is formed of aluminum.

5. The data input/output line structure of claim 1, wherein a resistance ratio of the second metal layer to the first metal layer is about 1:10.

6. The data input/output line structure of claim 1, wherein each of the plurality of strapping connectors has a hole to be filled with one of the first and the second metal layers.

7. A data input/output line structure for facilitating data input to and output from each of memory cells in a semiconductor memory device, the data input/output line structure comprising:
   a bit line in each of the memory cells through which the data is input to and output from a respective memory cell;
   a first signal line connected to the bit line;
   a second signal line connected to the bit line; and
   a plurality of connectors for providing a plurality of connections between the first signal line and the second signal line, wherein the first signal line has a first resistance value and the second signal line has a second resistance value, the second resistance value is lower than the first resistance value.

8. The data input/output line structure of claim 7, wherein the first signal line is parallel with the second signal line.

9. The data input/output line structure of claim 7, wherein the first and the second signal lines are perpendicular to the bit line.

10. The data input/output line structure of claim 7, wherein the connections between the first and the second signal lines are arranged at substantially regular intervals.

11. The data input/output line structure of claim 7, wherein the first and the second signal lines are formed from a first and a second metal layers, respectively.

12. The data input/output line structure of claim 11, wherein the first metal layer is formed of one of tungsten and copper.

13. The data input/output line structure of claim 11, wherein the second metal layer is formed of aluminum.

14. The data input/output line structure of claim 11, wherein each of the connectors has a hole to be filled with a material of one of the first and the second metal layers, wherein the material filling the hole has higher penetrability than that of the other material.

15. The data input/output line structure of claim 7, wherein a ratio of the second resistance of the second signal line to the first resistance of the first signal line is about 1:10.

16. A data input/output line structure for connecting to a bit line in each of a plurality of memory cells in a semiconductor memory device, comprising:
   first and second signal lines connected in parallel via a plurality of strapping connectors, the first and second signal lines forming a single data line for facilitating data input and output to and from the bit line, wherein the second signal line has a lower resistance than the first signal line.

17. The data input/output line structure of claim 16, wherein the first and second signal lines are formed from a corresponding first and second metal layers.

* * * * *